(12) United States Patent
Iyer et al.

(10) Patent No.: US 9,494,649 B2
(45) Date of Patent: Nov. 15, 2016

(54) ADAPTIVE DIGITAL DELAY LINE FOR CHARACTERIZATION OF CLOCK UNCERTAINTIES

(71) Applicant: Advanced Micro Devices, Inc., Sunnyvale, CA (US)

(72) Inventors: Arun S. Iyer, Bangalore (IN); Prashanth Vallur, Bangalore (IN); Shraddha Padiyar, Bangalore (IN); Amit Govil, Bangalore (IN)

(73) Assignee: Advanced Micro Devices, Inc., Sunnyvale, CA (US)

( * ) Notice: Subject to any disclaimer, the term of this patent is extended or adjusted under 35 U.S.C. 154(b) by 950 days.

(21) Appl. No.: 13/731,583

(22) Filed: Dec. 31, 2012

(65) Prior Publication Data

US 2014/0184243 A1 Jul. 3, 2014

(51) Int. Cl.
*H03K 5/14* (2014.01)
*G01R 31/317* (2006.01)
*H03K 5/1534* (2006.01)
*H03K 5/13* (2014.01)

(52) U.S. Cl.
CPC ... *G01R 31/31726* (2013.01); *G01R 31/31708* (2013.01); *H03K 5/133* (2013.01); *H03K 5/14* (2013.01); *H03K 5/1534* (2013.01)

(58) Field of Classification Search
CPC .................. G01R 31/31726; G01R 31/31708; H03K 5/133; H03K 5/14; H03K 5/1534
See application file for complete search history.

(56) References Cited

U.S. PATENT DOCUMENTS

| | | | | |
|---|---|---|---|---|
| 5,245,231 A | * | 9/1993 | Kocis | H03K 5/135 327/161 |
| 7,844,875 B2 | | 11/2010 | Jun et al. | |
| 7,973,549 B2 | * | 7/2011 | Joshi | G01R 31/31725 324/750.3 |
| 8,085,074 B1 | * | 12/2011 | Janardhanan | H03L 7/10 327/149 |
| 8,912,824 B1 | * | 12/2014 | Arp | H03K 5/1534 326/104 |

FOREIGN PATENT DOCUMENTS

GB 2509595 A * 7/2014 .......... H03L 7/0812

* cited by examiner

*Primary Examiner* — Jung Kim

(57) ABSTRACT

An integrated circuit (IC) measures uncertainties in a first signal. The IC comprises a programmable delay circuit to introduce a programmable delay to the first signal to generate a first delayed signal. The IC further comprises a digital delay line (DDL) comprising a first delay chain of delay elements having input to receive the first delayed signal. The DDL further comprises a set of storage elements, each storage element having an input coupled to an output of a corresponding delay element of the first delay chain, and an output to provide a corresponding bit of a digital reading. The DDL additionally comprises a decoder to generate a digital signature from the digital reading and a controller to iteratively adjust the programmed delay of the programmable delay circuit to search for a failure in a resulting digital signature.

17 Claims, 7 Drawing Sheets

ADAPTIVE DIGITAL DELAY LINE FOR CHARACTERIZATION OF CLOCK UNCERTAINTIES

BACKGROUND

Field of the Disclosure

The present disclosure relates generally to integrated circuit devices and more particularly to on-die signal measurement and characterization.

Description of the Related Art

Variations in a semiconductor fabrication process can lead to non-identical performance between resulting integrated circuit (IC) devices. Typically, these variations are manifested in variations in the doping concentration, dimensions, and other parameters of the transistors of the IC devices, and can result in significant changes to the duty cycle, skew rate, and other timing uncertainties in signaling conducted by the transistors. To accommodate these process variations, semiconductor device manufacturers may implement an on-die digital delay line (DDL) to obtain an on-die measurement of a timing characteristic of a signal.

Typically, the DDL comprises a delay chain of inverters (or buffers) and a set of flip-flops to sample the output of each inverter of the delay chain. Decoder logic is then used to generate a digital reading from the outputs of the set of flip-flops. However, to cover all standard process corners, the number of inverter/flip-flop combinations in the DDL conventionally covers the entire spread from the slowest process corner (that is, the slow-nmos slow-pmos, or SS, process corner), to the average process corner (that is, the typical-nmos typical-pmos, or TT, process corner) to the fastest process corner (that is, the fast-nmos fast-pmos, or FF, corner). Moreover, conventional decoding logic used to decode the digital output of the DDL utilizes a flip-flop for each flip-flop used in the DDL.

In many circumstances, the total number of flip-flops needed to implement a conventional DDL and corresponding decoding logic for the contemplated process corner spread can number in the hundreds, which can be impracticable due to power-consumption, area, and accuracy considerations, particularly when multiple on-die clock measurement circuits are contemplated for a system. Moreover, DDL-based characterization circuits often require near zero-skew between the various flip-flops in order to operate accurately. Given the number of flip-flops implemented in conventional DDL-based characterization circuits, this design requirement often is difficult to meet, especially at the lower voltages often found in modern IC devices.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
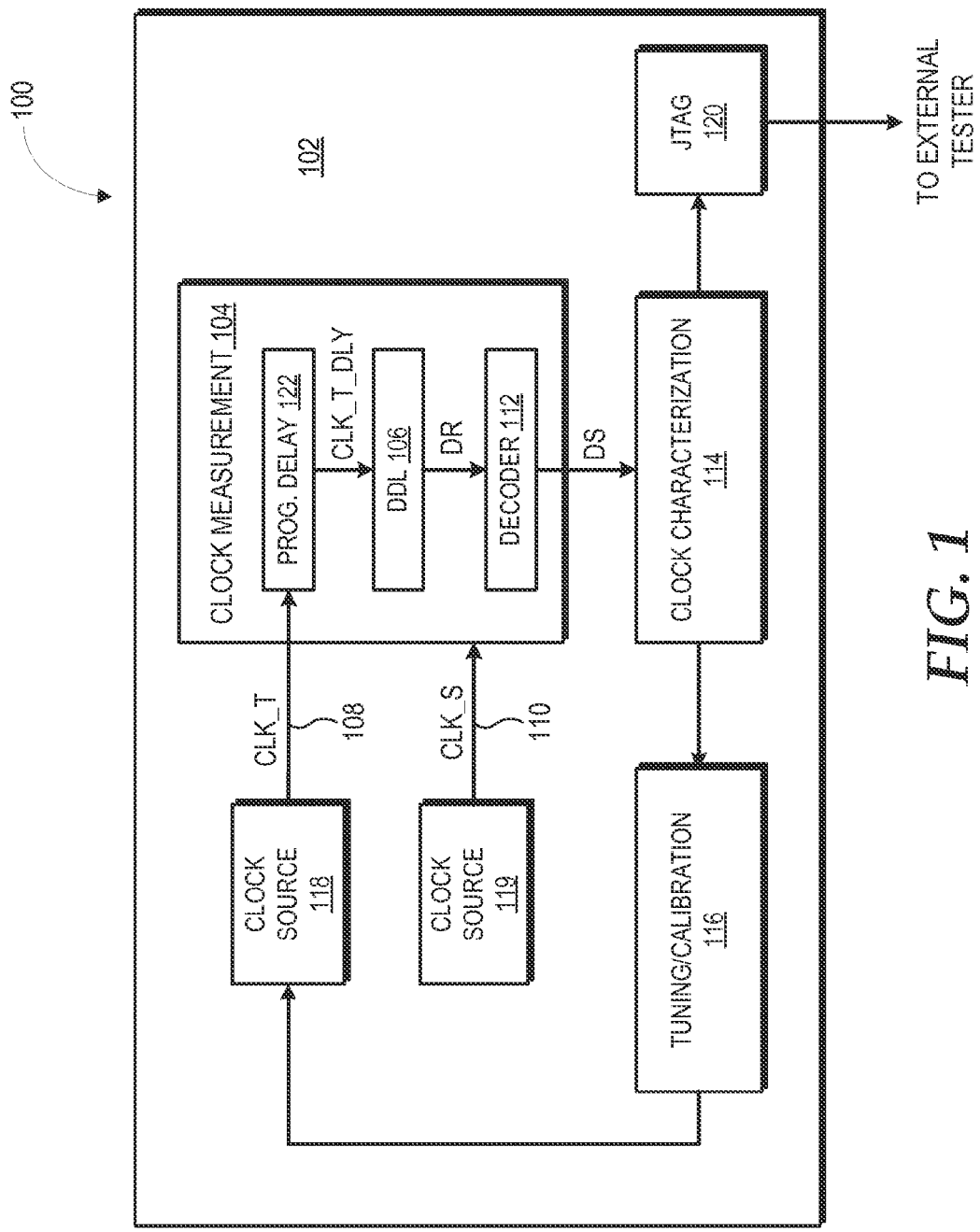
FIG. 1 is a block diagram illustrating an integrated circuit (IC) device implementing on-die clock measurement and characterization in accordance with some embodiments.

FIG. 1 illustrates an integrated circuit (IC) device 100 employing on-die clock measurement and characterization in accordance with some embodiments. The IC device 100 can comprise any of a variety of electrical components utilizing clock-synchronized circuitry, such as a central processing unit (CPU), graphics processing unit (GPU), digital signal processor (DSP) or other type of processor, an application specific integrated circuit (ASIC), and the like. A die 102 of the IC device 100 implements an on-die clock measurement circuit 104 that employs an adaptive digital delay line (DDL) 106 to obtain digital readings (denoted "DR") for a test signal 108 (also denoted as "CLK_T") at one or more process corners. The test signal 108 can comprise a clock signal or other signal to be characterized. The digital reading are measurements of a relationship between the test signal 108 and a sampling signal 110 (also denoted as "CLK_S"). The sampling signal 110 can include a clock signal from a signal source 119 or other signal used to characterize the test signal 108. Thus, the sampling signal 110 can be used to characterize the uncertainties in certain timing parameters of the test signal 108. The test signal 108 can comprise, for example, a processor core clock signal and the sampling signal 110 can comprise, for example, a bus clock signal.

The on-die clock measurement circuit 104 further employs a decoder 112 to generate a digital signature (denoted "DS") from each digital reading, whereby the digital signature identifies any "failing" points that may be present in the corresponding digital reading at the corresponding process corner. An on-die characterization circuit 114 thus may use the digital signatures to characterize one or more parameters of the test signal 108, such as skew, period jitter, or duty cycle distortion. The control signaling based on the characterized parameters then may be supplied to an on-die tuning/calibration circuit 116 of the IC device 100 for use in tuning a signal source 118 of the test signal 108 or for use in calibrating one or more other circuits that utilize the test signal 108 to accommodate for the characterized parameters. Alternatively, the digital signatures generated by the clock measurement circuit 104, or characterization information generated by the characterization circuit 114, may be transmitted off-die via a Joint Test Action Group (JTAG) port 120 or other input/output (I/O) port to an external tester, which then may use the digital signatures or characterization information to characterize the IC device 100 for manufacturing sort or binning, or for external tuning and calibration of circuits of the IC device 100, and the like.

In some embodiments, the clock measurement circuit 104 employs an adaptive sliding-window-based DDL sampling process. To this end, the DDL 106 comprises a chain of delay elements (e.g., buffers or inverters) and corresponding sampling elements (e.g., flip-flops or latches) that together form a sampling window that is "tuned" to a selected process corner by introducing, via a programmable delay circuit 122, a specified delay into the test signal 108 before the resulting delayed representation of the test signal 108 (that is, the delayed test signal denoted "CLK_T_DLY") is sampled by the sampling window represented by the DDL 106, whereby the introduced delay is selected for a process corner to be tested. This sampling process can be repeated with iterative adjustment to the introduced delay until a "failure" is detected in the resulting digital signature, whereby the "failure" is a deviation from an expected pattern and indicates that the sampling window is positioned in a process corner sub-range reflective of the process corner of the IC device 100. The characterization circuit 114 thus may characterize one or more parameters of the test signal 108 based on the introduced delay that resulted in the digital signature containing the detected failure (which represents a coarse estimation of the tested parameter) and based on the position of the failure within the digital signature (which represents a finer estimation of the tested parameter).

For ease of illustration, exemplary techniques are described in the context of characterizing a test clock signal (one embodiment of the test signal 108) using another clock signal as the sampling signal 110. In such instances, the DDL 106 may implement flip-flops clocked by the sampling signal 110 as the storage elements used to sample the delay elements of the chain of delay elements. However, the present disclosure is not limited to this example context. In other embodiments, a clock signal or a non-clock signal (another embodiment of the test signal 108) may be characterized using a non-clock sampling signal (e.g., another embodiment of the sampling signal 110). In such instances, the storage elements of the DDL 108 may be implemented as latches instead, and the sampling signal 110 can constitute a strobe signal or other trigger signal that engages the latches to sample the outputs of the delay elements of the chain of delay elements. The techniques described below may be adapted to this scenario using the guidelines provided herein. As such, reference to "clock" is merely for illustrative purposes of the example context and applies to "non-clock" scenarios as well unless otherwise noted.

Figure 2:
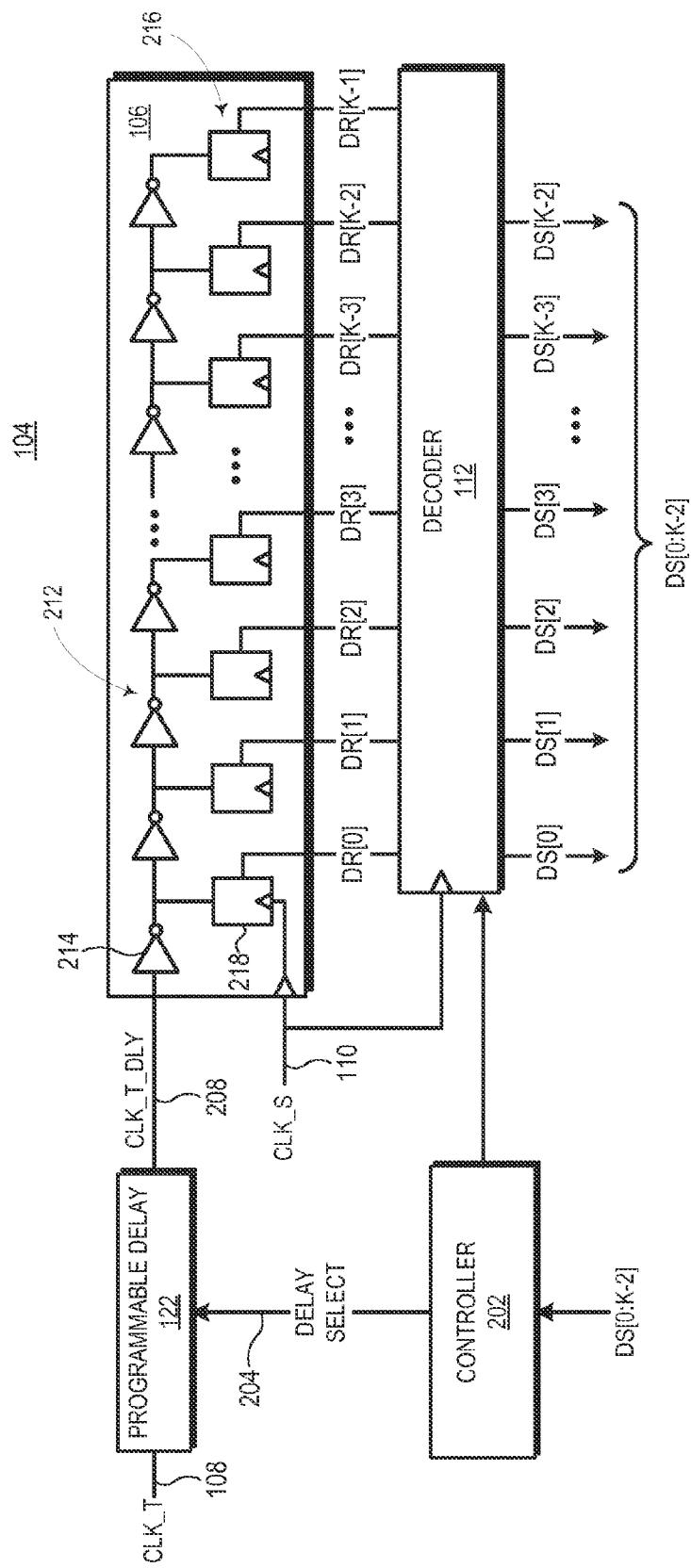
FIG. 2 is a block diagram illustrating a clock measurement circuit having an adaptive digital delay line (DDL) in greater detail in accordance with some embodiments.

FIG. 2 illustrates an example implementation of the clock measurement circuit 104 in accordance with some embodiments. In this example, the clock measurement circuit 104 includes the programmable delay circuit 122, the DDL 106, the decoder 112, and a controller 202. The programmable delay circuit 122 includes an input to receive the test signal 108, an input to receive a delay select signal 204 from the controller 202, and an output to provide a delayed representation of the test signal 108 in the form of a delayed test signal 208 (also denoted as clock signal "CLK_T_DLY"), wherein the amount of delay introduced by the programmable delay circuit 122 into the delayed sampled clock 208 is controlled by the delay select signal 204. Example implementations of the programmable delay circuit 122 are described in greater detail below with reference to FIGS. 4 and 5.

The DDL 106 includes a test clock input to receive the delayed test signal 208, a sample clock input to receive the sampling clock 110, and an output to provide digital readings DR having K bits. The DDL 106 further includes a delay chain 212 of K delay elements 214 and a corresponding set 216 of K D-type flip-flops 218 (referred to herein as "flops"). In alternative embodiments whereby the sampling signal 110 is a non-clock signal, the flops 218 instead may be implemented as latches or other types of storage elements. The initial delay element 214 in the delay chain 212 has an input connected to the test clock input to receive the delayed test signal 208, and each subsequent delay element 214 in the delay chain 212 has an input coupled to the output of the previous delay element 214 in the delay chain 212. Each flop 218 includes a data input coupled to the output of a corresponding delay element 214, a clock input coupled to the input 210 to receive the sampling clock 110, and an output to provide a corresponding bit of the K bits of the digital reading. Thus, each flop 218 samples the output state of the corresponding delay element 214 at the active edge of the sampling clock 110 and provides this sampled output state as the corresponding bit of a digital reading. Each delay element 214 and its corresponding flop 218 together constitute a unit-measurement stage of the DDL 106. For ease of illustration, embodiments of the delay chain 212 using inverters are described in greater detail below, but the same teachings may be applied for a buffer-based delay chain implementation with the appropriate logic modifications.

The digital reading sampled at a given clock cycle of the sampling clock 110 serves as a measurement of the performance characteristics of the transistor devices of the IC device 100, and thus an indicator of the particular process corner in which the IC device 100 may be categorized. When the delayed test signal 208 goes through a logical transition i.e., switches to a new logical state, then based on the relative occurrence of that transition with respect to the active edge of the sampling clock 110, some of the sampling flops 216 capture that new logical value of the test signal 208 while others of the sampling flops 216 capture the previous logical value. To illustrate, if the delayed test signal 208 changes from logical value of 0 to 1 at some time instant, then that transition propagates through the delay chain 212 with each element 214 of that chain delaying the transition edge by an amount that varies among different process corners; that is, the delay will be greater at a slower corner and less at a faster corner. For example, if the delay introduced by each element of the chain is approximately T, then it takes a time of about T*K for that transition to propagate through the entire delay chain 212. If the active edge of sampling clock 110 happens well after the time instant when the new logical value of test signal 208 has passed through the entire delay chain 212, then all the sampling flops 216 will capture the new logical value of test signal 208. This scenario is referred to herein as "all captures new." If the active edge of sampling clock 110 happens to be well before the time instant when the new logical value of test signal 208 has not even passed through the first element of the delay chain 212, then all the sampling flops 216 will capture the older logical value of test signal 208. This scenario is referred to herein as "all captures old". If the active edge of sampling clock 110 happens to be somewhere in between the above two cases (that is, if it happens at the time instant when the new logical value of test signal 208 has passed through the first element of the delay chain 212 and has not reached the final element of the delay chain 212), then some of the sampling flops 216 will capture the newer logical value of test signal 208 and others will capture the older logical value of test signal 208. This scenario is referred to herein as a "crossover case".

The digital reading DR will be a continuous vector of alternating 1's and 0's in both the cases of "all captures old" and "all captures new". In the "crossover case", the digital reading DR will not be a continuous vector of alternating 1's and 0's, but instead will have a series of alternating 1's and 0's until some point where there will be a sequence of two 0's or two 1's and then followed by alternating 1's and 0's from there onwards. And that point in the vector where the series continuity breaks is referred to herein as "crossover point" or "failure point". Also, the digital reading DR in that case is referred to as containing the "failure band". As such, both the "all captures old" and "all captures new" scenarios are referred to as "no-crossover" scenarios.

Table 1 below is used to illustrate an example of this operation. For ease of illustration, the DDL 106 is depicted as having nine stages (that is, K=9), although in typical implementations the number of stages would be greater.

TABLE 1

Example Digital Readings (K = 9)

|  | Bit 0 | Bit 1 | Bit 2 | Bit 3 | Bit 4 | Bit 5 | Bit 6 | Bit 7 | Bit 8 |
|---|---|---|---|---|---|---|---|---|---|
| $DR_{NO\text{-}CROSSOVER}$ | 1 | 0 | 1 | 0 | 1 | 0 | 1 | 0 | 1 |
| $DS_{NO\text{-}CROSSOVER}$ | 0 | 0 | 0 | 0 | 0 | 0 | 0 | 0 | 0 |
| $DR_{CROSSOVER}$ CASE A | 1 | 0 | 0 | 1 | 0 | 1 | 0 | 1 | 0 |
| $DS_{CROSSOVER}$ CASE A | 0 | 1 | 0 | 0 | 0 | 0 | 0 | 0 | 0 |
| $DR_{CROSSOVER}$ CASE B | 1 | 0 | 1 | 0 | 0 | 1 | 0 | 1 | 0 |
| $DS_{CROSSOVER}$ CASE B | 0 | 0 | 0 | 1 | 0 | 0 | 0 | 0 | 0 |
| $DR_{CROSSOVER}$ CASE C | 1 | 0 | 1 | 0 | 1 | 0 | 1 | 1 | 0 |
| $DS_{CROSSOVER}$ CASE C | 0 | 0 | 0 | 0 | 0 | 0 | 1 | 0 | 0 |

Since the delay chain 212 is comprised of inverters in this case, the output of each capture flop 218 will be complement of its adjacent flop in the set 216 of flops in either "no-crossover" scenario. That is, the digital reading would be the expected bit pattern "101010101" (that is strictly alternating between 1 and 0) in the event that the delayed test signal 208 was at a low level at the active clock edge of the sampling clock 110. The row "$DR_{NO\text{-}CROSSOVER}$" of Table 1 illustrates this situation. In the case of a "crossover" scenario, the continuous stream of alternate 1's and 0's will break at a certain point and that point is referred to as "deviation" or "crossover" or "failure" point. The position of that deviation in the bit pattern depends on the switching speeds of the inverters of the delay chain 212 and thus reflects the process corner of the IC device. As illustrated by the row labeled "$DR_{CROSSOVER}$ CASE A" of Table 1, the IC device 100 at a slower process corner A would experience this deviation earlier in the delay chain 212, such as at the output of the third inverter, and thus the bit output by the third flop 218 would not be the complement of the previous bit, and this deviation would then propagate through the remaining stages of the DDL 106, so that the resulting digital signature is "100101010". Likewise, as illustrated by the row labeled "$DR_{CROSSOVER}$ CASE B" of Table 1, the IC device 100 at a more typical process corner B (B faster than A) would experience this deviation later in the delay chain 212, such as at the output of the fifth inverter, and thus the bit output by the fifth flop 518 would not be the complement of the previous bit, and this deviation would then propagate through the remaining stages of the DDL 106 such that the resulting digital signature is "101001010." Moreover, as illustrated by the row labeled "$DR_{CROSSOVER}$ CASE C" of Table 1, the IC device 100 at a faster process corner C (C faster than B) would experience this deviation even later in the delay chain 212, such as at the output of the eighth inverter of the delay chain 212, and thus the resulting digital signature would be "10101010".

In order to identify the position of a deviation, i.e., "failure", with respect to the output of the DDL 106, each digital reading output by the DDL 106 is decoded by the decoder 112 into a digital signature of X bits, whereby each bit value reflects whether there is a detected failure at a corresponding stage of the DDL 106. To illustrate using the example described above (with X=8), the row labeled "$DS_{NO\text{-}CROSSOVER}$" of Table 1 illustrates a digital signature of all 0's (that is, a no-hot value of "00000000"). The row labeled "$DS_{CROSSOVER}$ CASE A" of Table 1 illustrates a decoding of the digital reading "$DR_{CROSSOVER}$ CASE A" to generate a one-hot digital signature "$DS_{CROSSOVER}$ CASE A" of "01000000", thereby identifying a failure occurring between the second and third inverters or stages of the DDL 106. Likewise, the row labeled "$DS_{CROSSOVER}$ CASE B" of Table 1 illustrates a decoding of the digital reading "$DR_{CROSSOVER}$ CASE B" to generate a one-hot digital signature "$DS_{CROSSOVER}$ CASE B" of "0001000", thereby identifying a failure occurring between the fourth and fifth inverters or stages of the DDL 106. As another example, the row labeled "$DS_{CROSSOVER}$ CASE C" of Table 1 illustrates a decoding of the digital reading "$DR_{CROSSOVER}$ CASE C" to generate a one-hot digital signature of "00000010", thereby identifying a failure occurring between the seventh and eight inverters or stages of the DDL 106.

Although the example above of Table 1 depicts a simple nine-stage DDL implementation covering the three closely-grouped theoretical process corners A, B, and C, in actual implementations the process corners to be evaluated are likely to have a much broader range, and the uncertainties in the test signal are likely to be more significant. In a conventional DDL-based clock measurement approach, a DDL is sized to cover the entire range of process corners of interest in a single digital reading, such that the number N of stages in a conventional DDL is determined based on the ratio of the expected nominal clock period of the sampled clock to the shortest inverter delay of all process corners (that is, the clock period divided by the inverter delay at the FF corner). To illustrate, assume that the test signal 108 is expected to operate a nominal clock period of 1000 picoseconds (ps) and the standard SS, TT, and FF process corners are expected to manifest as inverter delays of 11 ps, 7 ps, and 5 ps, respectively. Under this assumption, a conventional DDL would require approximately 90 stages (1000 ps/11 ps) to cover the SS corner, approximately 143 stages (1000 ps/7 ps) to cover the TT corner, and approximately 200 stages (1000 ps/5 ps) to cover the FF corner. Thus, the conventional DDL would need 200 stages (N=200) in order to have the digital reading cover the entire process corner range from the SS corner to the FF corner. As each stage implements a flop, this conventional approach would require 200 flops in the DDL, as well as an equivalent number of flops in the decoder used to generate the digital signature from the output of the conventional DDL.

Thus, to characterize the uncertainties in a 1 GHz clock signal with a FF corner inverter delay of 5 ps, approximately 400 flops are needed in a conventional DDL-based approach. With the relatively high number of flops needed, implementing a clock measurement circuit in this conventional manner can become prohibitive in terms of area and power, particularly when multiple instances of the clock measuring circuit are to be employed in an IC device. Moreover, this relatively high number of flops in a conventional DDL can impact the accuracy of the measurement due to the skew that typically is present between flops of the conventional DDL.

An analysis of the trend across corners in the digital signatures generated in accordance with a conventional DDL-based clock measuring approach reveals that detected failures typically cluster within clearly-delineated bands of flops that map to the standard SS, TT, and FF process corners. As such, the digital signatures contain significant redundancy due to this clustering. In some embodiments, the clock measuring circuit 104 leverages this redundancy to reduce the number of DDL stages needed to measure a tested clock signal by employing a sampling window tuning approach whereby the DDL 106 uses a relatively small number of unit-measurement stages to form a sampling window that can be tuned to a particular sub-range of the process corner range by adjusting the delay introduced into the delayed test signal 208, and thus in effect "sliding" the sampling window across process corner sub-ranges over multiple sampling iterations.

Figure 3:
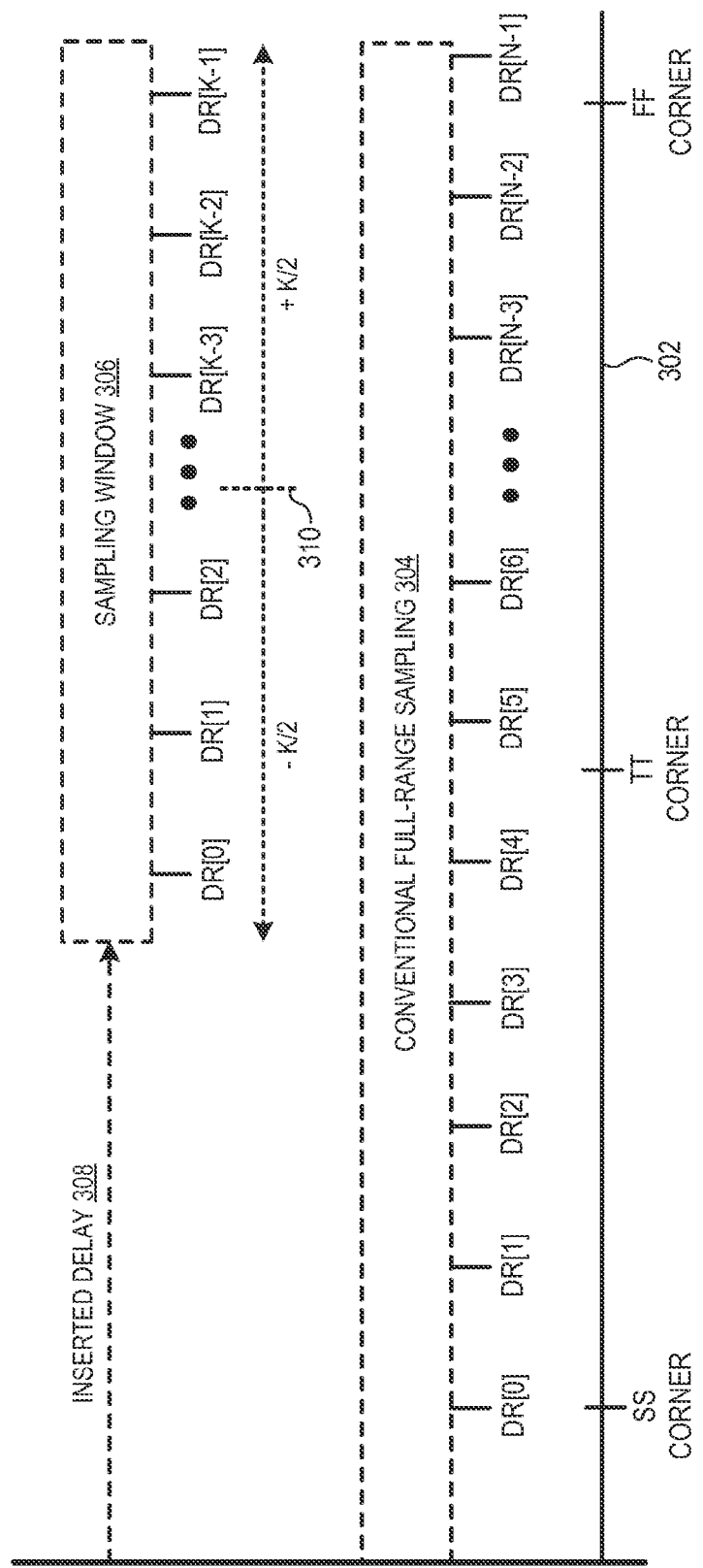
FIG. 3 is a diagram illustrating a sliding sampling window employed by an adaptive digital delay line (DDL) of the clock measurement circuit of FIG. 2 in accordance with some embodiments.

FIG. 3 depicts this sample tuning approach in comparison with a conventional full-range DDL-based clock measurement approach. In the diagram of FIG. 3, the baseline 302 represents an inverter-delay time axis for a process corner range from a SS corner to a FF corner. As noted above, a conventional DDL-based clock measurement approach would implement a DDL that has a number N of stages sufficient to measure the entire process corner range in a single digital reading, as represented by conventional DDL sample range 304. Under this approach, approximately 2*N flops are necessary to sample the entire process corner range in one sampling and to decode the resulting digital reading to obtain the corresponding digital signature. In contrast, the clock measurement circuit 104 implements a smaller number K of stages (K<N) in the DDL 106 to form a sampling window having a smaller sub-range represented by sampling window range 306. The position of the sampling window (that is, the sub-range covered by the sampling window) is set by an introduced delay 308 inserted into the test signal 108 by the programmable delay circuit 122 to generate the delayed test signal 208 that is sampled by the DDL 106.

In operation, the controller 202 initializes a clock measurement process by programming the programmable delay circuit 122 to introduce an initial amount of delay so as to set the sampling window at an initial position for a first sampling cycle of the measurement process. The DDL 106 then obtains a digital reading from the DDL 106 from the sampling window for the sampling cycle, and the decoder 112 decodes the digital reading to generate a corresponding digital signature. This sampling and decoding process may be repeated with iterative adjustments to the introduced delay 308 for each successive sampling cycle until a failure is detected in the digital signature, at which point the magnitude of the introduced delay 308 and the position of the detected failure within the sliding sampling window (as reflected in the digital signal resulting from the digital reading output by the sampling window) can be used as a representation of the point of failure within the entire process corner range, and thus used as a representation of the process corner into which the IC device 100 falls or as a representation of a parameter of the tested clock signal 108.

The number K of stages implemented in the DDL 106 (that is, the "size" of the sampling window) can reflect the expected uncertainty for the test signal 108. To illustrate, to characterize an uncertainty of +/−100 megahertz (MHz) around a 1 gigahertz (GHz) frequency of operation, the K stages should cover a frequency window of 900 MHz to 1.1 GHz, or a time window of approximately 200 ps (i.e., +/−100 ps). Thus, for the sampling window to cover this range with an example FF corner inverter delay of 5 ps, the DDL 106 should have +/−20 stages (+/−100 ps/5 ps), or 40 stages total. More generally, the number K of stages implemented in the DDL 106 can be expressed as $$K \geq \frac{\text{range}}{\text{inv\_dly\_FF}}$$

where "range" represents the uncertainty range in units of time (e.g., 200 ps in the example above) and "inv_dly_FF" represents the expected inverter delay at the FF corner (e.g., 5 ps in the above example).

The programmable delay circuit 122 implements a plurality of selectable delay settings, each selectable delay setting implementing a different number of chained delay elements (e.g., inverters or buffers) that together introduce a corresponding amount of delay used as padding to position the sliding sampling window at a center 310 of a corresponding process corner. So positioned, the sampling window has approximately K/2 stages to sample on both sides of the center 310 of the corresponding process corner. The number of delay elements needed to provide the desired padding reflects the expected inverter delay at the corresponding process corner, and may be expressed as:

$$\text{dly\_elements} \cong \frac{\text{clk\_period} - \left(\frac{K}{2} * \text{inv\_dly\_cnr}\right)}{\text{inv\_dly\_cnr}}$$

Where dly_elements represents the number of delay elements to be implemented by the programmable delay circuit 122 to generate the corresponding introduced delay 308, clk_period is the nominal clock period of the test signal 108, K is the number of stages of the DDL 106, and inv_dly_cnr is the expected inverter delay at the target process corner. To illustrate using the examples above, for a test signal 108 having a clock period of 1000 ps, a clock uncertainty of +/−100 ps, and inverter delays of 11 ps, 7 ps, and 5 ps for the SS, TT, and FF process corners respectively, the DDL 106 implements K=40 stages (K/2=20). From this, the programmable delay circuit 122 implements approximately 180 delay elements [(1000 ps−(20*5 ps))/5 ps] to introduce a delay of 900 ps (1000 ps−(20*5 ps)) to center the sampling window at the sub-range of 900 ps to 1100 ps over the FF corner. The programmable delay circuit 122 implements approximately 125 delay elements [(1000 ps−(20*7 ps))/7 ps] to introduce a delay of 860 ps (1000 ps−(20*7 ps)) to center the sampling window at the sub-range of 860 ps to 1140 ps over the TT corner. The programmable delay circuit 122 implements approximately 70 elements [(1000 ps−(20*7 ps))/7 ps] to introduce a delay of 780 ps (1000 ps−(20*11 ps)) to center the sampling window at the sub-range of 780 ps to 1220 ps over the SS corner.

Figure 4:
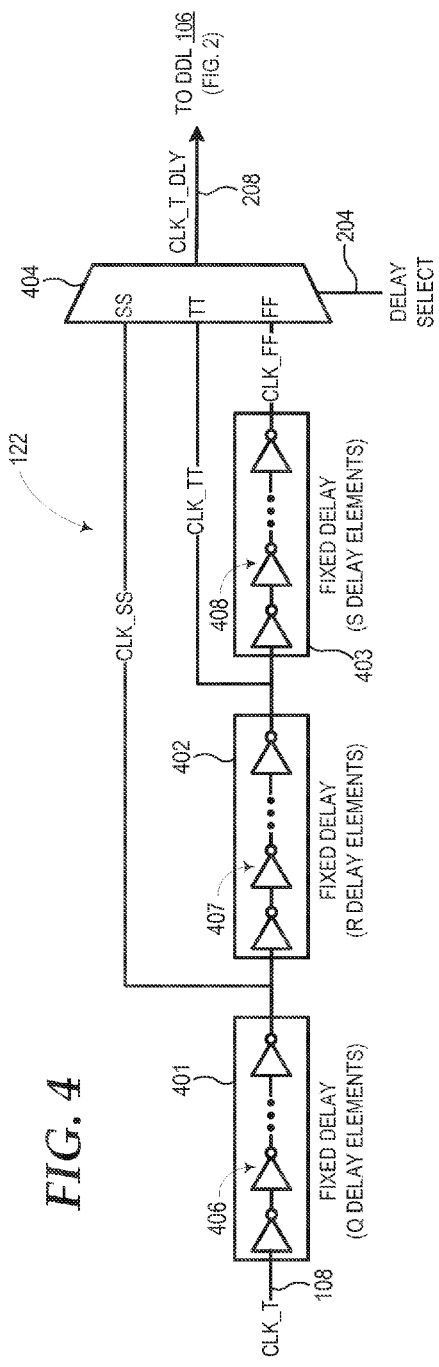
FIG. 4 is a circuit diagram illustrating an example implementation of a programmable delay circuit of the adaptive DDL of the clock measurement circuit of FIG. 2 in accordance with some embodiments.
Figure 5:
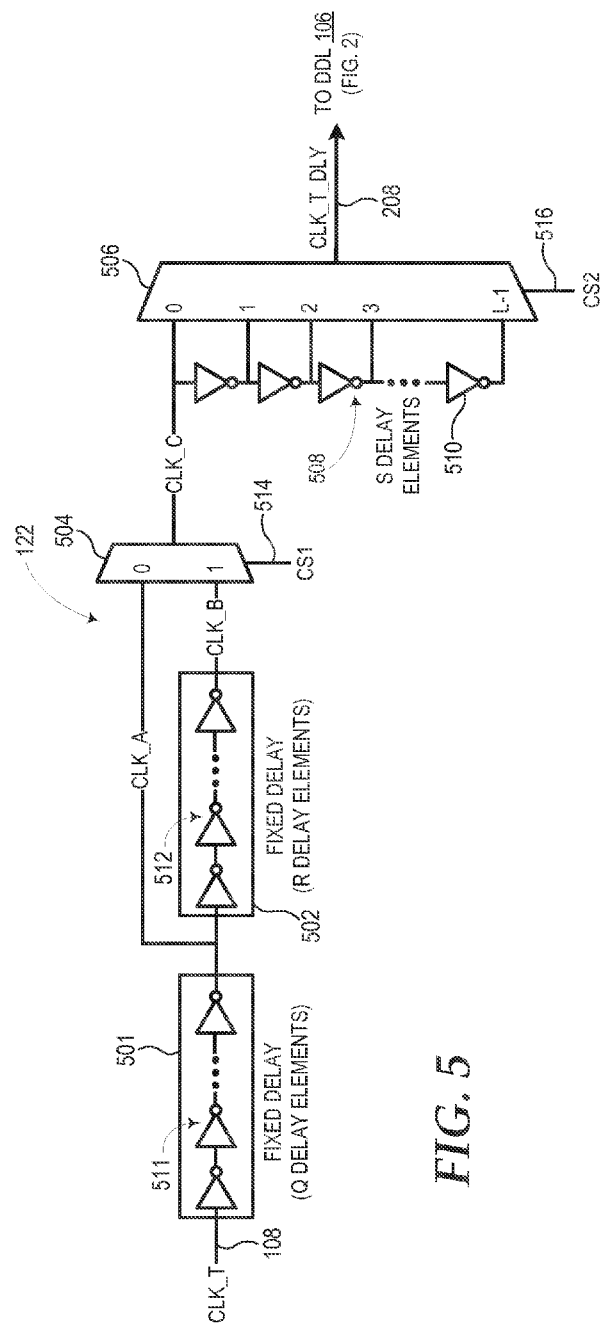
FIG. 5 is a circuit diagram illustrating another example implementation of a programmable delay circuit of the adaptive DDL of the clock measurement circuit of FIG. 2 in accordance with some embodiments.

FIGS. 4 and 5 illustrate example implementations of the programmable delay circuit 122 for inserting the introduced delay 308 into the test signal 108 to generate the delayed test signal 208 in accordance with some embodiments. In the example implementation of FIG. 4, the programmable delay circuit 122 takes a coarse-grained approach to the granularity of the adjustments made to the introduced delay 308. In this implementation, the programmable delay circuit 122 has M fixed delay settings to cover M process corners, with each fixed delay setting implementing a relatively coarse increase in the introduced delay 308. In the depicted example of FIG. 4, the programmable delay circuit 122 provides three (M=3) delay settings to cover the SS, FF, and TT corners, wherein the particular delay setting is selected by the delay select signal 204 from the controller 202 (FIG. 2). To this end, the programmable delay circuit 122 includes delay stages 401, 402, and 403 and a multiplexer 404. The delay stage 401 includes an input to receive the test signal 108, an output to provide a first intermediate delayed representation of the test signal 108 (denoted clock signal "CLK_SS" in FIG. 4), and delay chain 406 of Q delay elements connecting the input to the output. The delay stage 402 includes an input coupled to the output of the delay stage 401, an output to provide a second intermediate delayed representation of the test signal 108 (denoted clock signal "CLK_TT" in FIG. 4), and delay chain 407 of R delay elements connecting the input to the output. The delay stage 403 includes an input coupled to the output of the delay stage 402, an output to provide a third intermediate delayed representation of the test signal 108 (denoted clock signal "CLK_FF" in FIG. 4), and delay chain 408 of S delay elements connecting the input to the output. The multiplexer 404 includes a plurality of inputs, each input to receive a corresponding one of the intermediate delayed clock signals CLK_SS, CLK_TT, and CLK_FF, and an output to provide a select one of the received clock signals as the delayed test signal 208 provided to the DDL 106.

It will be appreciated that the clock signal CLK_SS represents the test signal 108 delayed by an amount equal to the product of Q inverters times the inverter delay of the inverters. Similarly, the clock signal CLK_TT represents the test signal 108 delayed by an amount equal to the product of Q+R inverters times the inverter delay, and the clock signal CLK_FF represents the test signal 108 delayed by an amount equal to the product of Q+R+S inverters times the inverter delay. Accordingly, the fixed delay stages 401, 402, and 403 are designed to include the combinations of inverters needed to provide the desired delay settings. To illustrate, an example was described above whereby the programmable delay circuit 122 is to provide introduced delays equivalent to 70 inverters, 125 inverters, and 180 inverters for the SS, TT, and FF corners, respectively. To provide these delay equivalents, the delay stage 401 can implement 70 inverters (Q=70) and the delay stages 402 and 403 can implement 55 inverters each (R=S=55), thereby allowing the controller 202 to select between an introduced delay equivalent to 70 inverters (by controlling the multiplexer 404 to select the clock signal CLK_SS), an introduced delay equivalent to 125 inverters (by controlling the multiplexer 404 to select the clock signal CLK_TT), or an introduced delay equivalent to 180 inverters (by controlling the multiplexer 404 to select the clock signal CLK_FF).

Although the coarse-grained approach of FIG. 4 can provide coverage for the standard SS, TT, and FF corners, this coarse-grained approach may not provide coverage for process corners between these standard corners depending on the span of the sampling window and the increase between delay settings. For example, if the sampling window has a span of +/−20 stages and the jump between each delay settings is the equivalent of 55 stages, the sampling window will not cover the entire process corner sub-range between the SS corner and the TT corner or between the TT corner and the FF corner. Accordingly, as illustrated by the example implementation of the programmable delay circuit 122 of FIG. 5, the programmable delay circuit 122 instead can implement a coarse-grained/fine-grained tuning of the sampling window to facilitate coverage of the entire process corner range.

In the example implementation of FIG. 5, the programmable delay circuit 122 includes delay stages 501 and 502, a multiplexer 504, a multiplexer 506, and a delay chain 508 of S inverters 510 or other delay elements. The delay stage 501 includes an input to receive the test signal 108, an output to provide a first intermediate delayed representation of the test signal 108 (denoted clock signal "CLK_A" in FIG. 5), and delay chain 511 of Q delay elements connecting the input to the output. The delay stage 502 includes an input coupled to the output of the delay stage 501, an output to provide a second intermediate delayed representation of the test signal 108 (denoted clock signal "CLK_B" in FIG. 5), and delay chain 512 of R delay elements connecting the input to the output. The multiplexer 504 includes inputs to receive the clock signals CLK_A and CLK_B, and an output to provide a select one of the received clock signal as a clock signal IN_C responsive to a control signal 514 (denoted "CS1") provided by the controller 202 (FIG. 2). The first inverter 510 of the delay chain 508 includes an input to receive the clock signal IN_C and the input of each successive inverter 510 is connected to the output of the previous inverter 510 in the delay chain 508. The multiplexer 506 has a plurality of inputs, including an input to receive the clock signal IN_C and inputs to receive the outputs of the inverters 510 of the delay chain 508, and an output to provide a selected one of the received signals as the delayed test signal 208 responsive to a control signal 516 (denoted "CS2") received from the controller 202. The control signals 514 and 516 together implement the delay select signal 204 (FIG. 2) used by the controller 202 to program a particular delay setting for the programmable delay circuit 122.

The fixed delay stages 501 and the multiplexer 504 provide a coarse tuning of the delay introduced by the programmable delay circuit 122, while the delay chain 508 of inverters and the multiplexer 506 provide for fine tuning of the introduced delay. Thus, through the control signals CS1 and CS2, the controller 202 can configure the programmable delay element 122 to introduce a delay into the delayed test signal 208 that can range from a delay equivalent to Q inverters to a delay equivalent to Q+R+S inverters in one-inverter-delay increments. Referring again to the example parameters described above, if the programmable delay circuit 122 of FIG. 5 is designed such that Q=70 inverters, R=55 inverters, and S=55 inverters, the programmable delay circuit 122 can finely adjust the introduced delay 308 so as to position the sampling window of the DDL 106 cover any sub-range of the entire 3-sigma process corner space using only 40 flops for the DDL 106, compared to the 200 flops necessary for a conventional DDL to cover the same 3-sigma process corner space.

Figure 6:
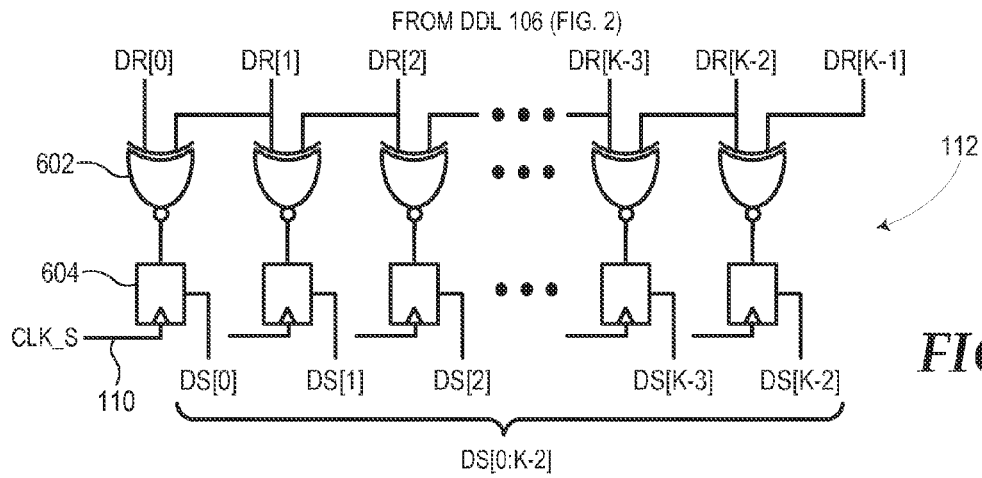
FIG. 6 is a circuit diagram illustrating an example implementation of a decoder of the clock measurement circuit of FIG. 2 in accordance with some embodiments.

FIG. 6 illustrates an example implementation of the decoder 112 of the clock measurement circuit 104 in accordance with some embodiments. As noted above, the DDL 106 provides a digital reading DR of K bits (DR[0:K−1]), whereby each bit is the output of a flop 218 (FIG. 2) that samples the output of a corresponding delay element 214 of the delay chain 212 (FIG. 2). In some embodiments, the delay elements 214 are implemented as inverters, and thus the expected format of the digital reading would be alternating set of 0's and 1's except for a break caused by the deviation, or "failure," as discussed earlier. To facilitate identification of this measured "failure," the decoder 112 decodes the digital readings output by the DDL 106 such that a deviation present in the digital reading will manifest itself as a "1" in the corresponding bit position of the digital signature, while all non-deviations are manifested as "0"s in the corresponding bit positions of the digital signature. Thus, a digital signature of, for example, "000000000" indicates that no measured failure was detected in the digital signature, whereas a digital signature of, for example, "000100000" indicates that a failure occurred between the third stage and the fourth stage of the DDL 106. In other embodiments, the relationship between the bit values 0 and 1 can be reversed.

To accomplish this encoding, the decoder 112 can include a set of K−1 XNOR gates 602 and a set of K−1 flops 604 for a digital reading of K bits. Each XNOR gate 602 at position "i" (i=0 to K−2) has inputs to receive the $i^{th}$ and $(i+1)^{th}$ bit of the digital reading (i.e., DR[i] and DR[i+1]) and an output to provide the result of the XNOR operation between the $i^{th}$ and $(i+1)^{th}$ bits. Each flop 604 has an input coupled to the output of a corresponding XNOR gate 602, a clock input to receive the sampling clock 110, and an output to provide a sample of the XNOR gate 602 at an active edge of the sampling clock 110. In other implementations, the delay elements 214 of the DDL 106 may be implemented as buffers rather than inverters, in which case the XNOR gates 602 may be replaced by XOR gates to achieve the same decoding result for the digital signature.

This example implementation of the decoder 112 implements K−1 flops, and the DDL 106 implements K flops to provide the sampling window. As explained above, a 40 stage (K=40) DDL 106 may be sufficient to cover the entire 3-sigma process corner range for clock characterization purposes under the clock parameters used in the examples described above, and thus approximately 80 (2*40) flops are used to implement the clock measurement circuit 104 under these example parameters. In contrast, as explained above a conventional DDL-based clock measurement approach requires approximately 400 flops for the same example parameters.

Figure 7:
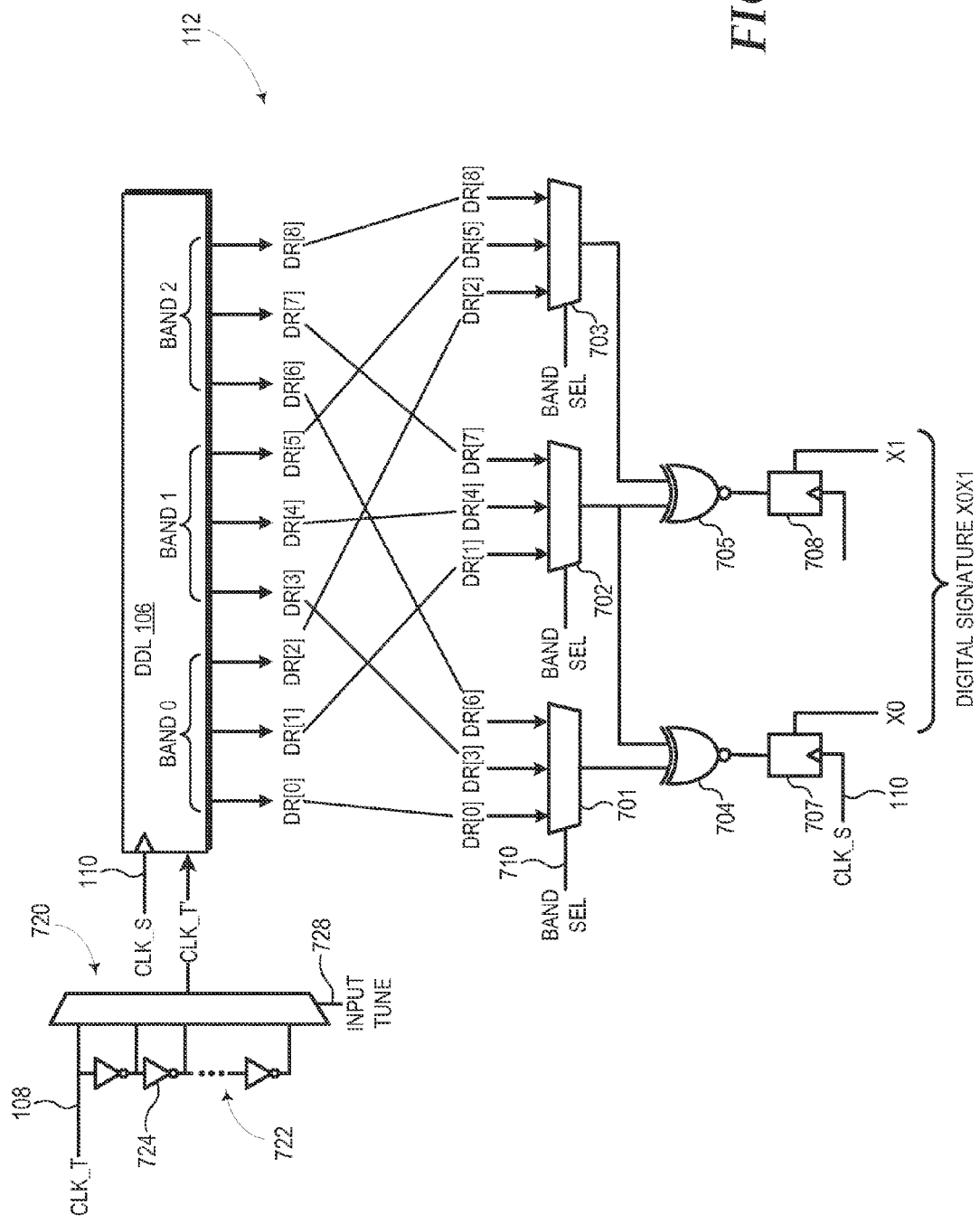
FIG. 7 is a circuit diagram illustrating another example implementation of a decoder of the clock measurement circuit of FIG. 2 in accordance with some embodiments.

FIG. 7 illustrates another example implementation of the programmable delay circuit 122 of the clock measurement circuit 104 in accordance with some embodiments. In this implementation, a digital reading having K bits output by the DDL 106 is grouped into a set of B bands, each band including an M bit segment of the digital reading (where M=K/B). A set of M multiplexers is implemented, with each multiplexer receiving a corresponding bit from each of the B bands. The output of each multiplexer is provided as an input to a corresponding XNOR gate of a set of M−1 XNOR gates, with the other input of the XNOR gate coming from the output of the adjacent multiplexer as shown in FIG. 7. The output of XNOR gate is coupled to a corresponding flop of a set of M−1 flops, where each flop samples the output of the corresponding XNOR gate in response to an active edge of the sampling clock 110, and whereby the outputs of the M−1 flops together provide an M−1 bit digital signature.

In the illustrated example, the DDL 106 provides a 9-bit digital reading (K=9), which is divided into three bands (B=3), with bits DR[0], DR[1], and DR[2] grouped into band 0, bits DR[3], DR[4], and DR[5] grouped into band 1, and DR[6], DR[7], and DR[8] grouped into band 2. A multiplexer 701 receives bits DR[0], DR[3], and DR[6] as inputs, a multiplexer 702 receives bits DR[1], DR[4], and DR[7] as inputs, and a multiplexer 703 receives bits DR[2], DR[5], and DR[8] as inputs. The outputs of the multiplexers 701 and 702 are input to an XNOR gate 704, the outputs of the multiplexers 702 and 703 are input to an XNOR gate 705. The outputs of the XNOR gates 704 and 705 are sampled by flops 707 and 708 based on the sampling clock 110 to generate bits X0 and X1, respectively, for a resulting digital signature.

In operation, the controller 202 iterates the multiplexers 701, 702, and 703 through each of the B bands via a band select signal 710 (denoted "BAND SEL" in FIG. 7) and notes whether a non-zero bit value is observed in the resulting digital signature XOX1 for a given band. By distributing the three bits of a given band among the three multiplexers 701, 702, and 703, only one of the resulting digital signatures will contain a non-zero bit value in the event that a deviation (i.e., two adjacent "0"s or two adjacent "1"s) is contained within a single band. For example, if DR[1] and DR[2] of band 0 are both "0" (rather than the expected alternating pattern of "01" or "10"), the illustrated decoding logic will generate a digital signature "01" (X0=0, X1=1) when band 0 is selected, whereas a digital signature "00" will be generated when each of bands 1 and 2 is selected in this example. Thus, with band 0 being the only band to generate a non-zero digital signature, the failure can be isolated to within band 0.

However, in certain instances, the deviation may happen between different bands. For example, if the deviation is present between bits DR[2] and DR[3], the digital signature resulting when band 0 is selected will be "00" and the digital signature resulting when band 1 is selected will also be "00". Since there are only two capture flops in the illustrated decode logic, this scenario can introduce errors in the measurement. Accordingly, in some embodiments, the decoder 112 implements a tunable delay circuit 720 to enable shifting of the sampled clock so as to move the deviation cleanly into a single band. As illustrated, the tunable delay circuit 720 includes a delay chain 722 of inverters 724 and a multiplexer 726. The first inverter of the delay chain 722 having an input to receive a clock signal to be sampled (e.g., the delayed sampled clock 208 or the sampled clock 108), and each successive inverter in the delay chain 722 having an input coupled to the output of the previous inverter. The multiplexer 726 includes a plurality of inputs, including an input to receive the clock signal to be sampled and inputs coupled to the outputs of the inverters 724 of the delay chain. The multiplexer 726 selects between these input signals for output to the DDL 106 based on a tuning signal 728 provided by the controller 202. Thus, when the controller 202 detects a deviation that spans multiple bands, the controller 202 can signal the multiplexer 728 to introduce an adjustable delay into the clock signal sampled by the DDL 106, and thus shift the deviation cleanly into a single band. For example, if a deviation is detected between bits DR[2] and DR[3] (which spans bands 0 and 1), the controller 202 can control the tunable delay circuit 722 to introduce a single-inverter delay into the test signal, thereby moving the deviation to bits DR[3] and DR[4], both of which reside in band 1.

The iterative band-tuning implementation of the decoder 112 illustrated by FIG. 7 permits a further reduction in the number of flops used to implement the clock measurement circuit 104. To illustrate, rather than implementing K−1 flops per the implementation of FIG. 6, the decoder 112 instead may require only K/B flops. Thus, if implemented in conjunction with the DDL 106, the resulting clock measurement circuit would use only K+(K/B) flops, rather than the 2*K−1 flops in the implementation of FIG. 6, or the 2*N (N>>K) flops required in conventional DDL-based clock measurement approaches.

Figure 8:
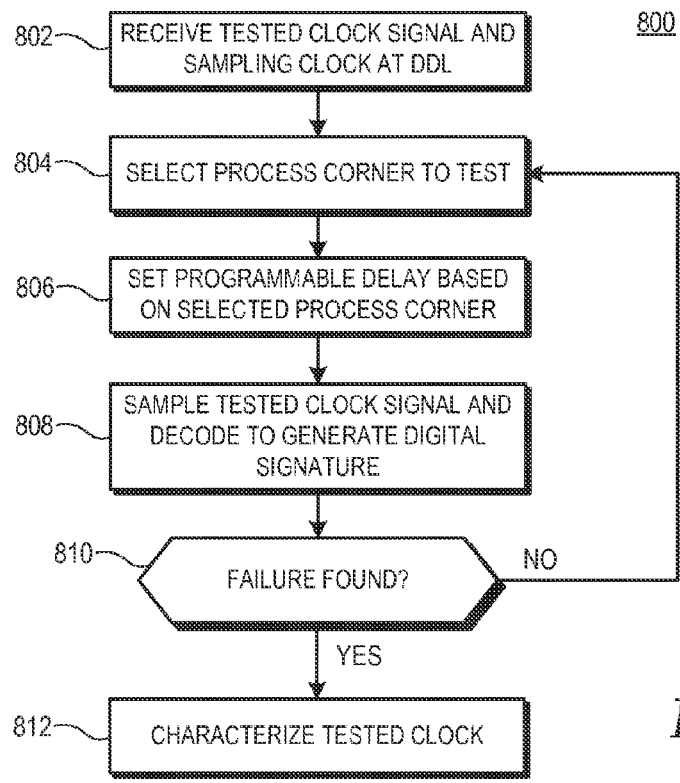
FIG. 8 is a flow diagram illustrating a method for performing on-die clock measurement and characterization using an adaptive DDL in accordance with some embodiments.

FIG. 8 illustrates an example method 800 for clock measurement and characterization using the clock measurement circuit 104 and characterization circuit 114 in accordance with some embodiments. As described above, the DDL 106 of the clock measurement circuit 104 operates as a sampling window, the position of which is iteratively adjusted to cover different process corner sub-ranges until a failure in the measurement is found, thereby identifying the process corner applicable to the IC device 100 and thus allowing characterization of the sampled clock. Accordingly, this method is initiated at block 802, whereupon the test signal 108 and the sampling signal 110 are received at the clock measuring circuit 104. The programmable delay circuit 122 introduces an adjustable delay into the test signal 108 to generate the delayed test signal 208. At block 804, the controller 202 selects the next process corner sub-range to test. In an initial iteration of block 804, the controller 202 selects a default process corner, such as the SS corner or the FF corner. At block 806, the controller 202 configures the control signaling for the programmable delay circuit 122 to select a delay setting corresponding to the default process corner. In response to this control signaling, the programmable delay circuit 122 adjusts the amount of delay it introduces into the delayed test signal 208. At block 808, the DDL 106 samples the delayed test signal 208 for the current sampling cycle of the sampling clock 110, and the resulting digital reading is provided to the decoder 112. The decoder 112 decodes the digital reading to generate a corresponding digital signature. At block 810, the controller 202 analyzes the digital signature to determine whether a measured failure is present in the digital signature (e.g., the digital signature has a "1" at one of its bit positions). If not, the method 800 returns to block 804 for another iteration of the process of blocks 804-810 whereupon the sampling window is shifted to another process corner for the next sample cycle by adjusting the delay introduced into the delayed sampled signal 208, a sample digital reading is taken at the new position of the sampling window, the resulting digital reading is decoded into a digital signature, and the digital signature is analyzed for a detected failure. As described above with reference to FIG. 4, the increment size of the introduced delay between iterations may be coarse-grained and cover only standard process corners or other major process corners. Alternatively, as described above with reference to FIG. 5, the increment size instead may be fine-grained and cover the entire range of process corners, with the trade-off of a potentially higher number of iterations needed to find the applicable process corner. This process is repeated until a failure in a resulting digital signature is detected at an iteration of block 810.

The particular position of the sampling window in the process corner range and the particular position of the failure in the digital signature (which corresponds to the position of the failure in the sampling window of the DDL 106) indicates the particular inverter delay time of the inverters of the delay chain 212 and thus indicates the particular process corner of the IC device 100. This information therefore may be used to characterize the sampled clock 108. To illustrate, if the sampling window is positioned at the SS corner when the failure is detected, the IC device 100 may be characterized as having slow transistor switching times, whereas the IC device 100 would be characterized as having typical transistor switching times if the sampling window were positioned at the TT corner when the failure was detected. Accordingly, at block 812, the characterization circuit 114 characterizes the IC device based on the digital signature and sampling window position. In some embodiments, the characterization circuit 114 provides the characterization information to one or more on-die tuning circuits that tune the signal source 118 (FIG. 1) of the test signal 108 so as to bring any particular parameter of the tested clock 108 to within specification, such as, for example, to place the rising edge of the tested clock signal at a certain desired time delay difference with respect to the rising edge of the sampling clock 110. In some embodiments, the characterization circuit 114 provides the characterization information to one or more on-die calibration circuits that calibrate circuits that are clocked by the test signal 108 so as to accommodate for the characterized parameters of the test signal 108.

In some embodiments, the apparatus and techniques described above are implemented in a system comprising one or more integrated circuit (IC) devices (also referred to as integrated circuit packages or microchips), such as the IC device 100 of FIG. 1. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 9:
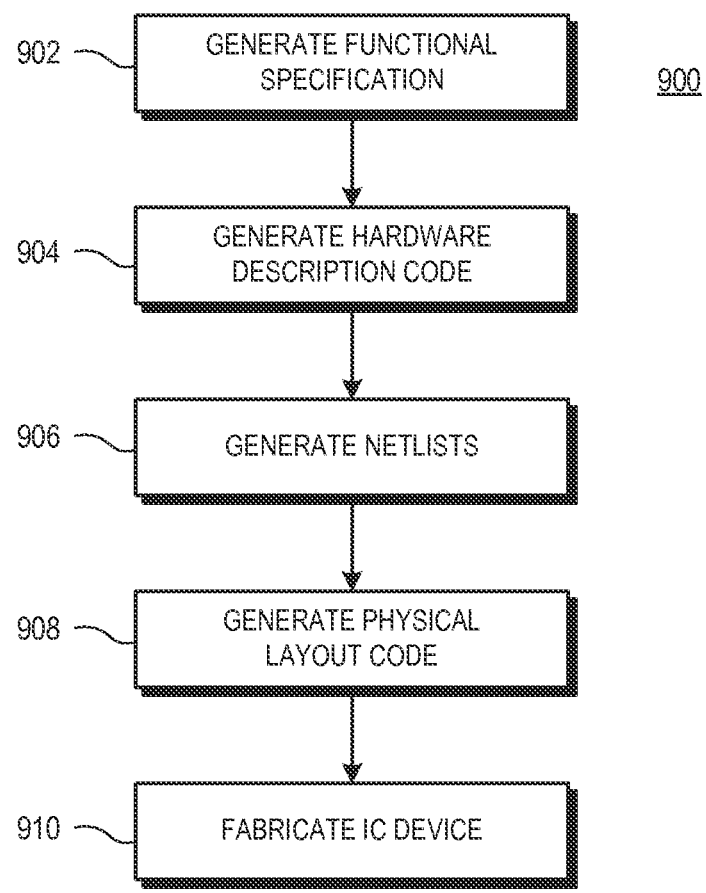
FIG. 9 is a flow diagram illustrating a method for designing and fabricating an integrated circuit (IC) device implementing on-die clock measurement and characterization in accordance with some embodiments.

FIG. 9 is a flow diagram illustrating an example method 900 for the design and fabrication of an IC device implementing one or more aspects. As noted above, the code generated for each of the following processes is stored or otherwise embodied in computer readable storage media for access and use by the corresponding design tool or fabrication tool.

At block 902 a functional specification for the IC device is generated. The functional specification (often referred to as a micro architecture specification (MAS)) may be represented by any of a variety of programming languages or modeling languages, including C, C++, SystemC, Simulink™, or MATLAB™.

At block 904, the functional specification is used to generate hardware description code representative of the hardware of the IC device. In some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 906 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 908, one or more EDA tools use the netlists produced at block 906 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 910, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An integrated circuit (IC) for measuring uncertainties in a first signal, the IC comprising:
   a programmable delay circuit to introduce a programmable delay to the first signal to generate a first delayed signal; and
   a digital delay line (DDL) comprising:
      a first delay chain of delay elements having input to receive the first delayed signal; and
      a set of storage elements, each storage element having an input coupled to an output of a corresponding delay element of the first delay chain, and an output to provide a corresponding bit of a digital reading; and
   a controller to adjust the programmable delay of the programmable delay circuit based on a combination of the corresponding bits of the digital reading.

2. The IC of claim 1, wherein the first signal is a clock signal.

3. The IC of claim 1, wherein the set of storage elements comprises a set of flip-flops, each flip flop comprising a clock input to receive a clock signal.

4. The IC of claim 1, wherein the programmable delay circuit comprises:
   a series of fixed delay stages having an input to receive the first signal; and
   a multiplexer comprising:
      a plurality of inputs, each input coupled to an output of a corresponding fixed delay stage of the series of fixed delay stages;
      an output to provide the first delayed signal; and
      a control input to switch the output among the plurality of inputs responsive to a control signal from the controller.

5. The IC of claim 1, wherein the programmable delay circuit comprises:
   a series of fixed delay stages having an input to receive the first signal;
   a first multiplexer comprising:
      a plurality of inputs, each input coupled to an output of a corresponding fixed delay stage of the series of fixed delay stages;
      an output to provide an intermediate delayed signal; and
      a control input to switch the output among the plurality of inputs responsive to a first control signal from the controller;

a second delay chain of delay elements having an input coupled to the output of the first multiplexer; and a second multiplexer comprising:
- a plurality of inputs including an input coupled to the output of the first multiplexer and inputs coupled to outputs of corresponding delay elements of the second delay chain;
- an output to provide the first delayed signal; and
- a control input to switch the output among the plurality of inputs responsive to a second control signal from the controller.

6. The IC of claim 1, further comprising:
a decoder to generate a digital signature from the digital reading.

7. The IC of claim 6, wherein the controller is to iteratively adjust the programmed delay of the programmable delay circuit to search for a failure in a resulting digital signature.

8. The IC of claim 7, further comprising:
a characterization circuit to characterize a parameter of the first signal based on the programmed delay that resulted in a failure in the resulting digital signature.

9. The IC of claim 8, further comprising:
a tuning circuit to adjust a source of the first signal based on the characterized parameter.

10. The IC of claim 8, further comprising:
a calibration circuit to adjust an operation of a circuit having the first signal as an input based on the characterized parameter.

11. A computer readable storage medium storing code that is operable to manipulate at least one computer system to perform a portion of a process to fabricate an integrated circuit (IC), the IC comprising:
- a programmable delay circuit to introduce a programmable delay to a first signal to generate a first delayed signal;
- a digital delay line (DDL) comprising:
  - a first delay chain of delay elements having input to receive the first delayed signal; and
  - a set of storage elements, each storage element having an input coupled to an output of a corresponding delay element of the first delay chain, and an output to provide a corresponding bit of a digital reading; and
- a controller to adjust the programmable delay of the programmable delay circuit based on a combination of the corresponding bits of the digital reading.

12. The computer readable storage medium of claim 11, wherein the programmable delay circuit comprises:
a series of fixed delay stages having an input to receive the first signal; and
a multiplexer comprising:
- a plurality of inputs, each input coupled to an output of a corresponding fixed delay stage of the series of fixed delay stages;
- an output to provide the first delayed signal; and
- a control input to switch the output among the plurality of inputs responsive to a control signal from the controller.

13. The computer readable storage medium of claim 11, wherein the programmable delay circuit comprises:
a series of fixed delay stages having an input to receive the first signal;
a first multiplexer comprising:
- a plurality of inputs, each input coupled to an output of a corresponding fixed delay stage of the series of fixed delay stages;
- an output to provide an intermediate delayed signal; and
- a control input to switch the output among the plurality of inputs responsive to a first control signal from the controller;

a second delay chain of delay elements having an input coupled to the output of the first multiplexer; and
a second multiplexer comprising:
- a plurality of inputs including an input coupled to the output of the first multiplexer and inputs coupled to outputs of corresponding delay elements of the second delay chain;
- an output to provide the first delayed signal; and
- a control input to switch the output among the plurality of inputs responsive to a second control signal from the controller.

14. The computer readable storage medium of claim 11, wherein the IC further comprises:
a decoder to generate a digital signature from the digital reading; and
wherein the controller is to iteratively adjust the programmed delay of the programmable delay circuit to search for a failure in a resulting digital signature.

15. The computer readable storage medium of claim 14, wherein the IC further comprises:
a characterization circuit to characterize a parameter of the first signal based on the programmed delay that resulted in a failure in the resulting digital signature.

16. The computer readable storage medium of claim 11, wherein the first signal is a clock signal.

17. The computer readable storage medium of claim 11, wherein the set of storage elements comprises a set of flip-flops, each flip flop comprising a clock input to receive a clock signal.

* * * * *